US007248033B2

(12) United States Patent
Anderson et al.

(10) Patent No.: US 7,248,033 B2
(45) Date of Patent: Jul. 24, 2007

(54) VECTOR NETWORK ANALYZER WITH INDEPENDENTLY TUNED RECEIVERS CHARACTERIZES FREQUENCY TRANSLATION DEVICES

(75) Inventors: Keith F. Anderson, Santa Rosa, CA (US); Richard R. Hawkins, Santa Rosa, CA (US); James C. Lui, Santa Rosa, CA (US); Kenneth H. Wong, Santa Rosa, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 299 days.

(21) Appl. No.: 10/967,877

(22) Filed: Oct. 18, 2004

(65) Prior Publication Data

US 2006/0084426 A1    Apr. 20, 2006

(51) Int. Cl.
 G01R 19/00    (2006.01)
 G01R 23/14    (2006.01)
(52) U.S. Cl. .................................. 324/76.11; 324/76.23
(58) Field of Classification Search ............. 324/76.11, 324/76.23
See application file for complete search history.

(56) References Cited

U.S. PATENT DOCUMENTS

| 6,064,694 | A | 5/2000 | Clark et al. | |
|---|---|---|---|---|
| 6,300,775 | B1 * | 10/2001 | Peach et al. ................. | 324/601 |
| 6,448,786 | B1 | 9/2002 | Dunsmore et al. | |
| 6,529,844 | B1 * | 3/2003 | Kapetanic et al. ........... | 324/601 |
| 6,690,722 | B1 | 2/2004 | Dunsmore et al. | |
| 7,002,335 | B2 * | 2/2006 | Shoulders ................. | 324/76.23 |

OTHER PUBLICATIONS

Agilent Technologies, Inc., "Improving Network Analyzer Measurements Of Frequency-Translating Devices", Application Note 1287-7, pp. 1-40.

(Continued)

Primary Examiner—Anjan Deb
Assistant Examiner—Timothy J Dole (57) ABSTRACT

A Vector Network Analyzer is equipped with receivers for measuring $a_1$, $b_1$, $a_2$ and $b_2$ and which can each be tuned to track either the RF signal (F1) applied to the FTD or to the IF (F2) produced by the FTD. Additional forward side and reverse side mixers are provided and are driven by the auxiliary LO for the FTD. The additional mixers can be located in the RF/IF path, such that there is a sequential double conversion of the RF/IF: one by the auxiliary LO followed by another conversion of those results by the main LO. The additional mixers could also be located it the LO path, such that the main LO is first converted to an image involving the auxiliary LO, and the RF/IF is then subsequently converted using that image as an 'artificial' LO. During a forward direction measurement of an FTD, the applied RF signal (F1) is converted to the IF with the additional forward side mixers that feeds the receivers for $a_1$ and $b_1$. This references the forward measurements to F2 and allows the FTD's input reflection and forward conversion magnitude and phase to be determined. A companion reverse direction measurement is to set the swept RF source to F2 of the FTD's output. The additional reverse side mixers convert F2 back to F1 so that receivers for $a_2$ and $b_2$ are at the same frequency at the FTD's input port. This references the reverse measurements to F1. The FTD's output reflection and reverse conversion magnitude and phase can be determined.

2 Claims, 6 Drawing Sheets

OTHER PUBLICATIONS

Agilent Technologies, Inc. "Agilent PN 8753-2 RF Compoment Measurements—Mixer Measurements Using the 8753B Network Analyzer", pp. 1-16, printed in U.S.A. Nov. 2000.

Joel Dunsmore, "Novel Method for Victor Mixer Characterization and Mixer Test System Vector Error Correction", pp. 1833-1836, IEEE MTT-S Digest 2002.

C.J. Clark, A.A. Moulthrope, M.S. Muha and C.P. Silva; "Network Analyzer Measuremetn of Frequency-Translating Devices", Microwave Journal Nov. 1996, pp. 114-126.

* cited by examiner

VECTOR NETWORK ANALYZER WITH INDEPENDENTLY TUNED RECEIVERS CHARACTERIZES FREQUENCY TRANSLATION DEVICES

BACKGROUND OF THE INVENTION

A VNA (Vector Network Analyzer) is an item of RF or microwave test equipment that characterizes the behavior of a path between two ports of a network. (Networks can have more than two ports, but the majority of networks of interest are of the two port variety. Techniques exist for combining a collection of two port characterizations to describe networks with more than two ports when such is necessary. Our present interest is with networks having two ports.) A two port network can be just about anything, ranging from a length of transmission line with connectors to an arrangement of components (e.g., an attenuator). The network might be passive (e.g., a resistive power splitter) or active (e.g., an amplifier). The usual VNA architecture has been devised with such linear networks in mind, and is for many applications generally quite satisfactory. It typically has a swept RF or microwave source that is applied first in a 'forward' direction to one end of the NUT (Network Under Test) while the amount and phase of applied power and reflected power are measured with calibrated narrowband receivers whose tuning tracks the frequency of the source. The power transmitted through the NUT in the forward direction is also measured by a similar receiver. The swept source is next applied to the NUT in the other ('reverse') direction, and similar measurements taken. The various receivers are all narrowband superheterodyne mechanisms using a single main LO (Local Oscillator) with mixers at their front ends to convert each of the four measured signals to a common IF (Intermediate Frequency). Each receiver measures both the amplitude and phase of its applied input signal. Since all the frequencies at the receivers are the same at any point in the sweep, the existence of a common reference plane will allow the measured phase values to be commensurate with one another, and the applied signal can be taken as the reference having 0° phase against which the phase values of the other signals are measured.

Associated with the measurements made by the receivers are four basic parameters customarily called $a_1$, $b_1$, $a_2$ and $b_2$. They are assumed to be voltage waves. By convention, the ports are subscripted as one and two, and, a is assumed to be the voltage incident upon or applied to a port, while b is the voltage emanating from or leaving a port. The ports are expected to be coupled to transmission lines of known characteristic impedance, say, 50 Ω. Recalling that power equals $E^2/R$, and since $a_1$ is a voltage, the square of $a_1$ is proportional to the power entering the network at Port One while the square of $b_2$ is proportional to the power leaving the network from Port Two. We shall follow the convention that the 'FORWARD' direction through the network is from Port One to Port Two, while 'REVERSE' is from Port Two to Port One. The narrowband superheterodyne receivers extract each of $a_1$, $b_1$, $a_2$ and $b_2$ as an amplitude and a phase. These complex values are the basis for an s-parameter measurement ('s' is for scattering) of $s_{21}$, $s_{12}$, $s_{11}$, and $s_{22}$ that can be understood and used on their own terms (as reflection and transmission coefficients), converted to other parameter types (e.g., Z, Y or H), or, converted to impedance and displayed as a function of applied frequency. Since measurements are taken in both forward and reverse directions, the results include all the transmission properties and the reflection properties of the NUT; which is to say, its complete characterization as a 'black box' with two ports.

As powerful as this usual manner of VNA operation is, it is not well suited for self-contained use with networks that are FTDs (Frequency Translation Devices), such as a mixer. In an FTD the frequency of the applied power at one port and the frequency of the power emerging from the other port are not the same. Typically, they will be separated by a fixed amount(s) determined by an auxiliary LO. If the NUT were a harmonic generator, then a more complicated case would obtain. The appearance of these frequencies that are different from that applied by the source means that they are not measured by the receivers (which are tracking the frequency of the source), with the consequence that the usual VNA architecture is not applicable to such networks. (One might also note that a mixer usually has three ports. On the other hand, it is usually not the case that a network path involving power flow through the LO port is of primary interest, and even if we supply an LO we can safely pretend that the LO for that mixer "is self-contained" and that the mixer is somehow a two port network that translates frequency.)

There have been several attempts to extend the architecture of the VNA to include the measurement of FTDs as two port networks. A first of these is the addition of a so-called 'frequency offset' mode of operation. This involves the inclusion of an auxiliary LO supplied to (or perhaps by) the NUT. In any event, the main LO is still arranged to operate in a phase and frequency locked loop that is driven by the untranslated applied frequency during times while a forward measurement is under way, so that $a_1$ and $b_1$ can be obtained as usual. Subsequent to that, but still during a forward measurement, the main LO is then driven by the translated frequency, which will allow the appropriate receiver to measure the magnitude (but not the phase) of $b_2$. During times when a reverse measurement is being made (if such makes sense for the type of device being tested), a corresponding situation obtains that has the same general structure (but in the other direction) where $a_2$ and $b_2$ are valid, and $b_1$ provides magnitude only. This circumstance arises because there is no way to provide a reference phase for $b_1$ or for $b_2$.

U.S. Pat. No. 6,064,694 discloses a method for characterizing FTDs that requires three mixers, an IF filter and three sets of measurements to obtain the s-parameters of a NUT under test that includes a mixer. However, errors caused by interactions owing to mismatches between the IF filter and the mixers are not removed from the measurement.

The techniques proposed by Joel P. Dunsmore in an article entitled "Novel Method for Vector Mixer Characterization and Mixer Test System Vector Error Correction" at pages 1833-35 of the MTT-S Digest, IMS2002, uses a pre-characterized mixer and filter pair to calibrate a VNA having a frequency offset mode of operation. It obtains relative phase and group delay characteristics of an FTD. However, the pre-characterized mixer must be reciprocal: RF to IF and IF to RF conversion must be the same, and the conversion loss must be small. The reverse characteristics cannot be measured, and an IF filter is required. The characteristics of that IF filter cannot be removed unless it has previously been separately characterized.

Joel P. Dunsmore and Michael E. Knox describe these and other related topics in two U.S. Pat. Nos. 6,448,786 B1 and 6,690,722 B1.

There is also an up-conversion/down-conversion technique that uses external mixing and filtering components to re-convert the IF from an FTD under test back to the frequency of the original RF stimulus. See, for example, FIGS. 4 and 24 in the Application Note 1287-7 entitled "Improving Network Measurements of Frequency-translating Devices" from Agilent Technologies, Inc. The test set-ups described there are very much do-it-yourself affairs (much has to be taken into account to be able to interpret the results), and do not lend themselves to reverse measurements.

Another disadvantage of several of these techniques is that they interpose ancillary items between the ports of the NUT and the test ports of the VNA. This raises various issued related to calibration and uncertainty, and generally makes the measurement more complicated.

What is needed is a way of improving the internal architecture of a VNA so that it can inherently make all the needed measurements on an FTD without the use of auxiliary paraphernalia and complicated external test set-ups.

SUMMARY OF THE INVENTION

An improved Vector Network Analyzer is equipped with receivers for $a_1$, $b_1$, $a_2$ and $b_2$ that can each be tuned to track either the RF signal (F1) applied to the FTD or to the IF (F2) produced by the FTD. This involves providing additional forward side and reverse side mixers that are driven by the auxiliary LO of the FTD; either the auxiliary LO is supplied to the FTD by the improved VNA in the first instance, or, the FTD supplies its own auxiliary LO which is also used by the improved VNA. The additional mixers can be located in the RF/IF path, such that there is a sequential double conversion of the RF/IF: one by the auxiliary LO followed by another conversion of those results by the main LO. The additional mixers could also be located it the LO path, such that the main LO is first converted to an image involving the auxiliary LO, and the RF/IF is then subsequently converted using that image as an 'artificial' LO.

In either case, the structure described in the above paragraph can be used to perform all the measurements that a conventional VNA can do. In addition, during a forward direction measurement of an FTD, the applied RF signal (F1) is converted to the IF with the additional forward side mixers that feeds the receivers for $a_1$ and $b_1$. This references the forward measurements to F2 and allows the FTD's input reflection and forward conversion magnitude and phase to be determined. A companion reverse direction measurement is to set the swept RF source to F2 of the FTD's output. The additional reverse side mixers convert F2 back to F1 so that the receivers for $a_2$ and $b_2$ are at the same frequency at the FTD's input port. This references the reverse measurements to F1. The FTD's output reflection and reverse conversion magnitude and phase can be determined. Once these instances of $a_1$, $b_1$, $a_2$ and $b_2$ have been determined at both F1 and F2, the operation of the VNA can proceed to provide the results of interest in any of the usual formats. It will be noted that for the measurements described above the results of frequency translation by the FTD are sent directly to the receivers for $a_1$ and $b_1$ or $a_2$ and $b_2$, without being further converted, which if it were to occur, could create various unwelcome images that complicate the issue of proper measurement by the receivers.

A related set of measurements can be performed in the reverse direction even if, for the sake of economy, the additional reverse side mixers are not supplied. In that case, however, the faux F2 remains the signal that reaches the receivers for a2 and b2, and any F1 produced by operating the FTD in reverse must be further converted to F2 by the forward side additional mixers. This could produce unwelcome images that accompany the F1 from the FTD that are included in the reconversion to F2 and disturb the operation of the forward side receivers for a1 and b1, so that it is advisable to include a filter in series with the Port One side of the FTD to suppress the images accompanying F1.

DESCRIPTION OF A PREFERRED EMBODIMENT

Figure 1:
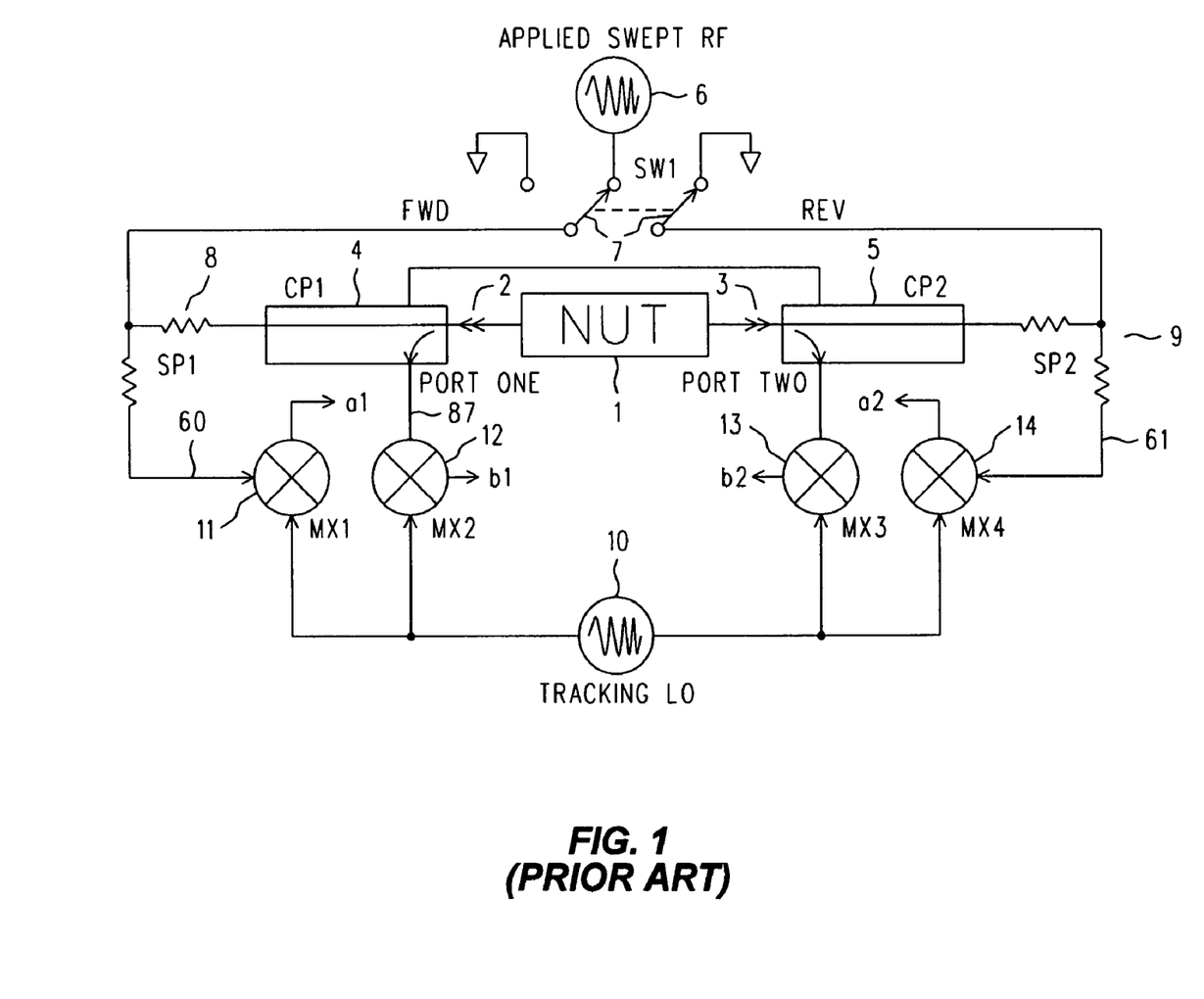
FIG. 1 is a simplified block diagram of the front end of a prior art vector network analyzer.

Refer now to FIG. 1, wherein is shown a simplified block diagram of the front end of a conventional VNA. We shall describe it briefly so that we may use it as a point of departure. A two port NUT (Network Under Test) 1 is coupled between two test ports Port One (2) and Port Two (3). The usual case is that lengths of high quality transmission line of known characteristic impedance (typically 50 Ω) are used to connect the test ports to the NUT 1. An internal Swept Source 6 supplies swept RF or microwave energy which is applied to one or the other of the two ports of the NUT. (In principle, the Source 6 need not be a sweeper, and could operate at selected fixed frequencies. In practice, however, the most interesting properties of a network are functions of frequency, and such an arrangement would today be viewed as hopelessly primitive; it is no longer found in commerce.) A switch 7 determines to which of the two ports the Swept Source's power is applied, with the customary notation associating a driven Port One with the direction called 'FWD' (forward) and a driven Port Two with the other (reverse) direction called 'REV.' The switch 7 might be a coaxial relay, or a semiconductor structure, depending upon the circumstances.

In FIG. 1 the switch 7 is shown as thrown or connected to make a FWD measurement. The applied power from the Swept Source 6 is divided by a power splitter SP1 (8). One portion (60) of the power from the Swept Source is applied to mixer MX1 (11). MX1 also receives a signal from a Tracking LO 10 that sweeps in step or synchrony with the Swept Source 6. The output of MX1 is an IF that provides the basic parameter $a_1$. (We are taking some customary liberties here that are useful simplifications. It is true that a mixer and an LO will produce an IF related to $a_1$, but the services of an entire calibrated narrowband tracking receiver are needed to actually get $a_1$. Such receivers in a VNA are quite conventional, and when there are more than one of them in a VNA their tuning needs to track each other and they need a common phase reference. The use of a common LO is what ensures this. The act of 'tuning' these receivers is principally performed when the LO is supplied for an initial heterodyne operation. This is where the simplification arises: we depict a mere mixer such as MX1 that is coupled to an LO and to an applied Port One input signal that is to be measured, and then say that the output of the mixer is $a_1$. The reader will appreciate that this use of mixer symbolism is a substitute for a more cumbersome (and more complicated) mechanism that is a tracking narrowband calibrated superheterodyne receiver that is all likelihood is at least a double conversion receiver in its own right.)

In summary, then, MX1 is the front end of an entire calibrated narrowband super heterodyne receiver that measures amplitude and phase, and which for the sake of brevity, we have omitted. The principal 'tuning' of the receiver is accomplished by control over the IF produced by MX1. That, in turn, is controlled by the relationship between the Swept Source 6 and the Tracking LO 10. The mixer MX1 really is, then, the front end of the calibrated tracking narrow band receiver, and it is customary to appreciate all of this while, for simplicity's sake, referring to the mixer as 'the receiver' even when we know full well that it is not the entire receiver. With that in mind, the measured $a_1$ may be taken as a reference indicating the amplitude and phase of what is applied to Port One (2).

Another portion of the power from the source is applied to Port One through a very broadband (and with flat, or at least well characterized, frequency response) directional coupler CP1 (4). Reflections from Port One of the NUT enter the auxiliary arm of the coupler CP1 and are applied to MX2 (12). Mixer MX2 is supplied with the same signal from the Tracking LO 10 as is MX1, and is also the front end of a receiver, in the same manner as was explained for MX1. In this case, however, MX2 and its receiver provide the basic parameter $b_1$, which is indicative of reflections from Port One. A further assumption is that any such reflections arise within the NUT, because Port Two is well terminated in its characteristic impedance and no energy is entering Port Two from outside the NUT (i.e., it is grounded through a termination by SW1).

It will readily be appreciated that the situation is symmetrically reversed when switch 7 is set to REV: Port One is grounded by termination and SP2 (9) divides applied power between the receiver whose front end is MX4 (14) and directional coupler CP2 (5). Driven by a reference power and phase (61), MX4 provides the basic parameter $a_2$, while reflections from Port Two (or from within the NUT) enter the auxiliary arm of CP2 and arrive at MX3 (13) to provide the basic parameter $b_2$.

Once the basic parameters $a_1$, $b_1$, $a_2$ and $b_2$ are in hand the VNA can determine their ratios and do the other conventional operations that produce the desired vector network analysis. As noted earlier, however, this conventional architecture cannot adequately cope with the case where the NUT is or includes an FTD.

Figure 2:
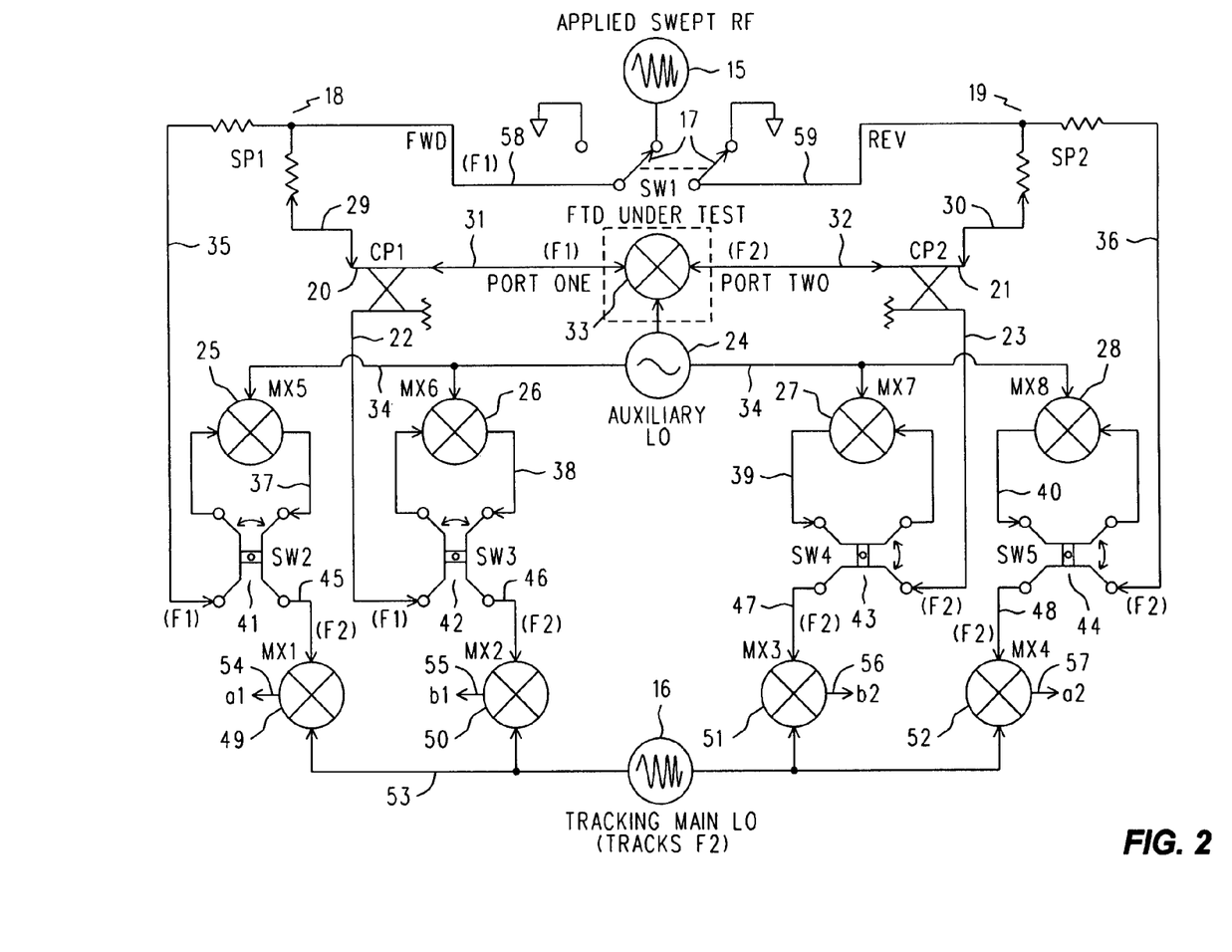
FIG. 2 is a simplified block diagram of the front end of a vector network analyzer equipped with independently tunable forward and reverse receivers in the RF path, showing a configuration for forward measurement.

Refer now to FIG. 2, wherein is shown a simplified block diagram of a VNA that can deal effectively with a NUT that is or includes an FTD 33. The FTD 33 translates an applied swept F1 to F2 using an (auxiliary) LO that may be internal to the device under test, and which is made available to the VNA, or, as is shown in the figure, supplied as signal 34 by an Auxiliary LO 24 that is part of the improved VNA.

To continue, then, an applied swept RF Source 15 provides excitation energy (58) at F1 that is applied through a switch SW1 (17) for measurements in the FWD and REV directions. Let us assume, as is shown in FIG. 2, that SW1 (17) is set to make a FWD (forward) measurement. F1 (58) is applied to a power splitter SP1 (18), from whence a portion 29 of that energy is sent through a broadband directional coupler CP1 (20) to excite Port One of the FTD under test 33. Meanwhile, Port Two of FTD 33 will be 'well grounded by termination' through SP2 (19) (and also staying grounded in accordance with other hygiene factors, such as the lack of feed through from MX4 and good isolation in and grounding by SW1 (17)). Power reflected from within the FTD 33 or from Port One enters the auxiliary arm of coupler CP1 and a known fraction of that reflected power 22 is applied through SW3 (42) to MX6 26 that also receives the auxiliary LO signal 34 from Auxiliary LO generator 24. Thus, the output 38 of the mixer MX6 26 (which will be sent to MX2) includes a component at F2 (among other frequency components, but recall that MX1-MX4 are each shorthand for individual tracking narrowband calibrated receivers, and we will se that MX1 and MX2 are tuned to track F2).

In like fashion, and owing to the operation of power splitter SP1 (18), another fractional portion 35 of the applied signal (F1) 58 is applied through SW2 (41) to a mixer MX5 (25) also coupled to the signal 34 from the Auxiliary LO 24. The result is an output 37 from MX5/SW2 that includes a component at F2. It is applied as signal 45 to MX1 49. At the same time, signal 46 from MX6/SW3 is applied to MX2. We arrange that MX5 and MX6 are essentially identical in their behavior (or, that they have been characterized so that we may later account for their differences . . . ). We now have two signals 45 and 46 that correspond to signals 60 and 87, respectively, of FIG. 1, except that they are at F2 instead of F1. Upon reflection, it will be appreciated that we may use these signals 45 and 46 to produce $a_1$ (54) and $b_1$ (55) from the receivers represented by MX1 49 and MX2 50, which are tuned by signal 53 from the Tracking Main LO 16 to track F2. After all, if the receivers represented by MX3 and MX4 are operated as they were in FIG. 1 (i.e., tuned according to the Tracking Main LO and without a preceding conversion), then $a_2$ and $b_2$ will be at F2, as well, and all four of them should be commensurate. Well, almost. First, in an ideal case there will be no $a_2$, owing to the grounding of SP2 (19) by SW1 (17). Next, the F1 to F2 conversion in MX5 and MX6 will be lossy, so $a_1$ and $b_1$ at F2 are of lower magnitude than their original counterpart $a_1$ and $b_1$ at F1. Store that thought, because we will fix that minor wart in due course.

Notice that despite the presence of additional mixers MX7 (27) and MX8 (28), the configuration of switches SW4 (43) and SW5 (44) in FIG. 2 means that the receivers MX3 and MX4 are indeed operated from the Tracking Main LO and without a preceding conversion: SW4 and SW5 are configured to bypass mixers MX7 and MX8 and route signal 23 directly into MX3 (as in FIG. 1) and route signal 36 directly into MX4 (again, as in FIG. 1). So we do have a set of $a_1$, $b_1$, $a_2$ and $b_2$ all at F2, but with a Port One to Port Two scale factor issue (caused by use of MX5 and MX6) to yet account for. The conversion loss from F1 to F2 in the mixers MX5 and MX6 can be discovered (if it is not already known) by temporarily setting switches SW2 and SW3 to bypass MX5 and MX6 (which is opposite the way they are shown in FIG. 2) and sweeping again at F1 with SW1 still in FWD (and with an unchanged power level). This will provide the ratios for MX5 and MX6 of $a_1$ @ F1 to $a_1$ @ F2 and $b_1$ @ F1 to $b_1$ @ F2 at all locations within the swept frequency range. This allows a correct interpretation of the measured $a_1$, $b_1$, $a_2$ and $b_2$ at F2 through the creation of an adjusted (or equivalent) $a_1$ @ F2 and $b_1$ @ F2 that may be used in place of the measured values.

Figure 3:
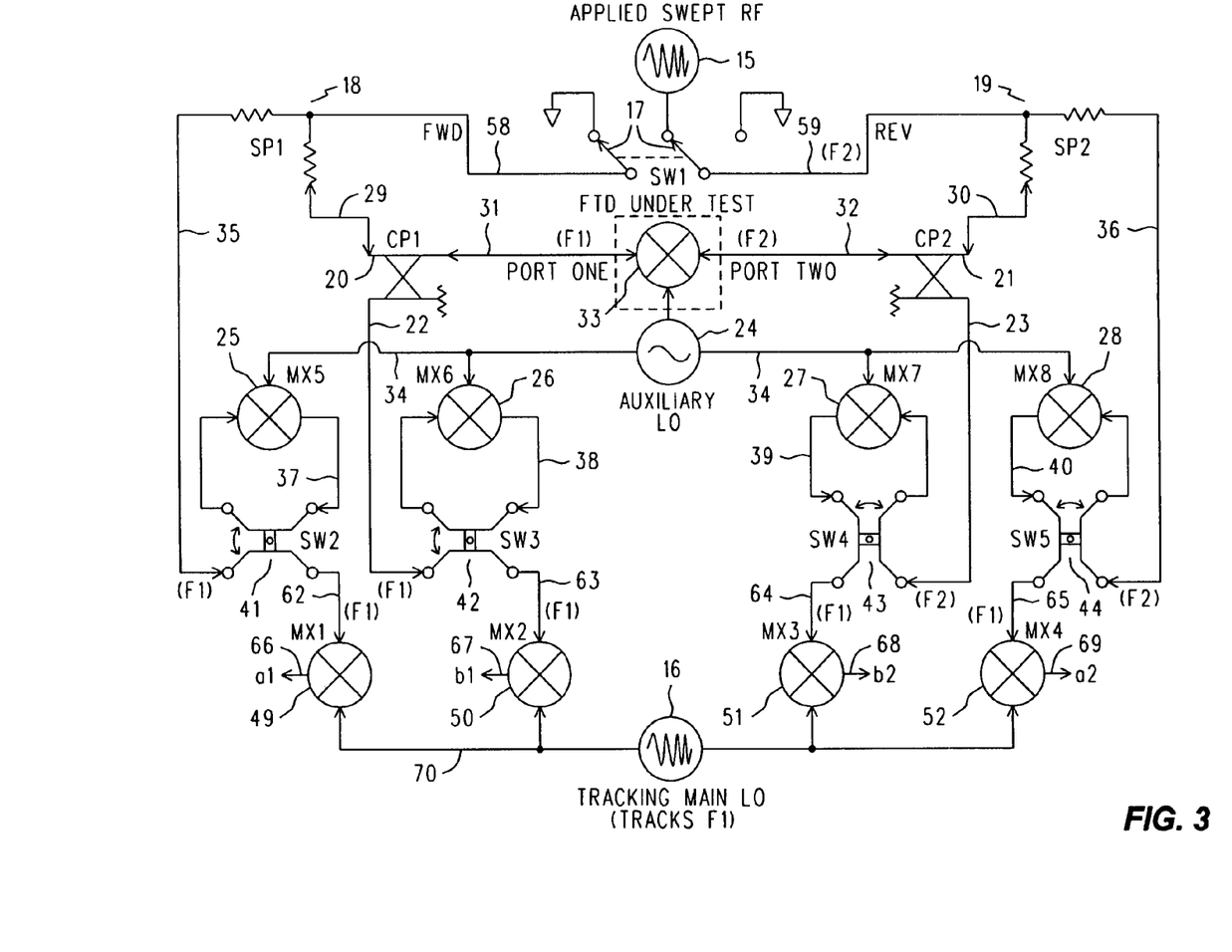
FIG. 3 is a simplified block diagram similar to that of FIG. 2 but configured to perform a reverse measurement.

Now consider in FIG. 3 the REV configuration of the same block diagram as was shown in FIG. 2. Everything is the same, except that each of the five switches SW1-SW5 is set to its other position, and the Tracking Main LO 16 is set to track F1 (i.e., signal 70 is now not the same as signal 53 in FIG. 2 was). Also, Source 15 has been changed to sweep at F2. Accordingly, it will be observed that MX5 and MX6 are bypassed, so that signal 35 is now signal 62, and signal 22 becomes signal 63. Furthermore, the roles of the mixers MX7/MX8 have thus been interchanged with the roles of MX5/MX6. MX7 and MX 8 are now performing conversions on signals 23 and 36, respectively, to produce signals 64 and 65, each of which have components at F1. That is, the F2 inputs to these mixers have been converted from F2 back to F1. We now have a set of basic parameters $a_1$, $b_1$, $a_2$ and $b_2$ at F1, although $a_2$ and $b_2$ @ F2 will have undergone a conversion loss (via MX7 and MX8) to arrive as (converted) F1 at MX3 and MX4, while $a_1$ and $b_1$ experienced conversion through the FTD (if it is reciprocal) and are directly measured by their associated receivers MX1 and MX2. Thus, we would benefit from having the ratio of $a_2$ @ F2 to $a_2$ @ F1 at all locations within the swept frequency range. This would also tell the conversion loss of MX7 if we assume that MX7 and MX8 are matched. The sought after ratio is readily obtained if we tune MX4 to F2, set SW5 to bypass MX8 and perform an additional measurement at F2 (assuming no change in the power level). This allows a correct interpretation of $a_1$, $b_1$, $a_2$ and $b_2$ at F1 through the creation of an adjusted (or equivalent) $a_2$ @ F1 and $b_2$ @ F1.

These 'correct interpretations' of $a_1$, $b_1$, $a_2$ and $b_2$ at F1 and $a_1$, $b_1$, $a_2$ and $b_2$ at F2 that are mentioned in the preceding two paragraphs can implemented as either as internal signal path calibration activities or using applicable VNA test port calibration techniques.

It will noted that in FIGS. 2 and 3 the additional mixers are located in the RF/IF path, such that there is a sequential double conversion of the RF/IF: one for the original RF at the FTD by the auxiliary LO followed by another conversion of those IF results by the main LO. Furthermore, note that FWD measurements are taken with the configuration of FIG. 2 and the receivers tuned to F2, while REV measurements are taken with the configuration of FIG. 3 with the receivers tuned to F1. In each of these cases there is either only one non-FTD or no conversion performed for the measurements before the signal reaches the receivers. In no case are signals that came from (passed through) the FTD converted before they are applied to their associated receivers.

Figure 4:
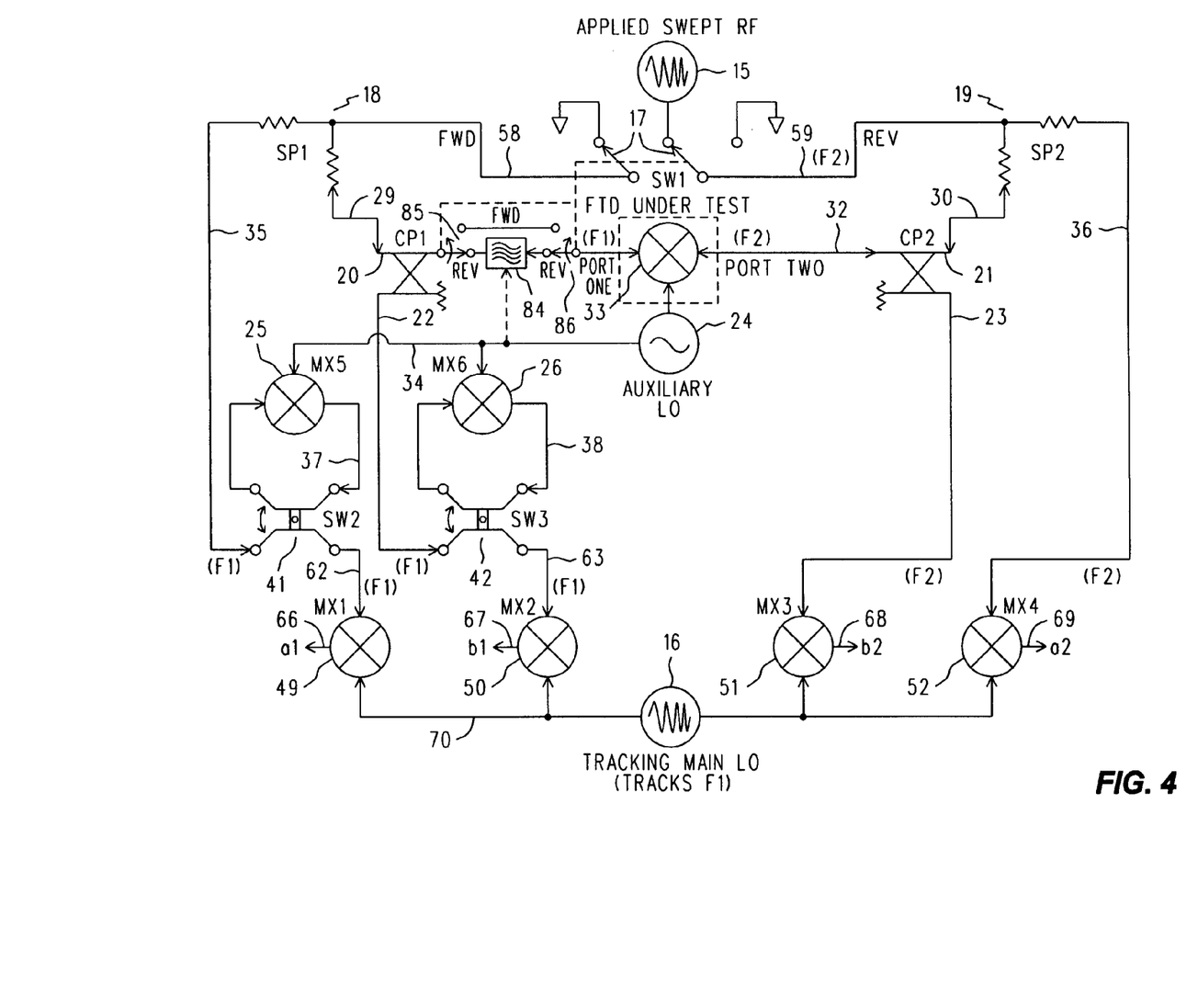
FIG. 4 is a simplified block diagram similar to that of FIGS. 2 and 3, but which omits, in the interests of economy, certain components used in the REV direction of measurement.

There is an economy configuration for locating the additional mixers MX5 and MX6 in the RF/IF path, and it is shown in FIG. 4. It closely resembles FIGS. 2 and 3, save for the absence of MX7 and MX8 and their associated switches SW4 and SW5. The block diagram of FIG. 4 also includes a bandpass filter 84 that is switched into series with Port One during REV measurements, but which is preferably absent during FWD measurements. Such a filter might be installed externally by the operator during REV measurements, and if so, be part of an 'extended test port' whose influence on measurements is accounted for by conventional VNA calibration techniques. Alternatively, the filter 84 might be a narrowband tracking filter supplied and automatically switched in (85, 86) and accounted for by the VNA itself. The filter 84 is needed because the image frequencies produced in the FTD under test produce other images after the next conversion at MX5 and at MX6. In contrast, in the FWD direction there are no such images in the signal reaching MX5 and MX6; there is instead only the applied signal from the Swept Source.

So far, we have discussed embodiments where the additional mixers MX5-MX8 have been located in the RF path.

Figure 5:
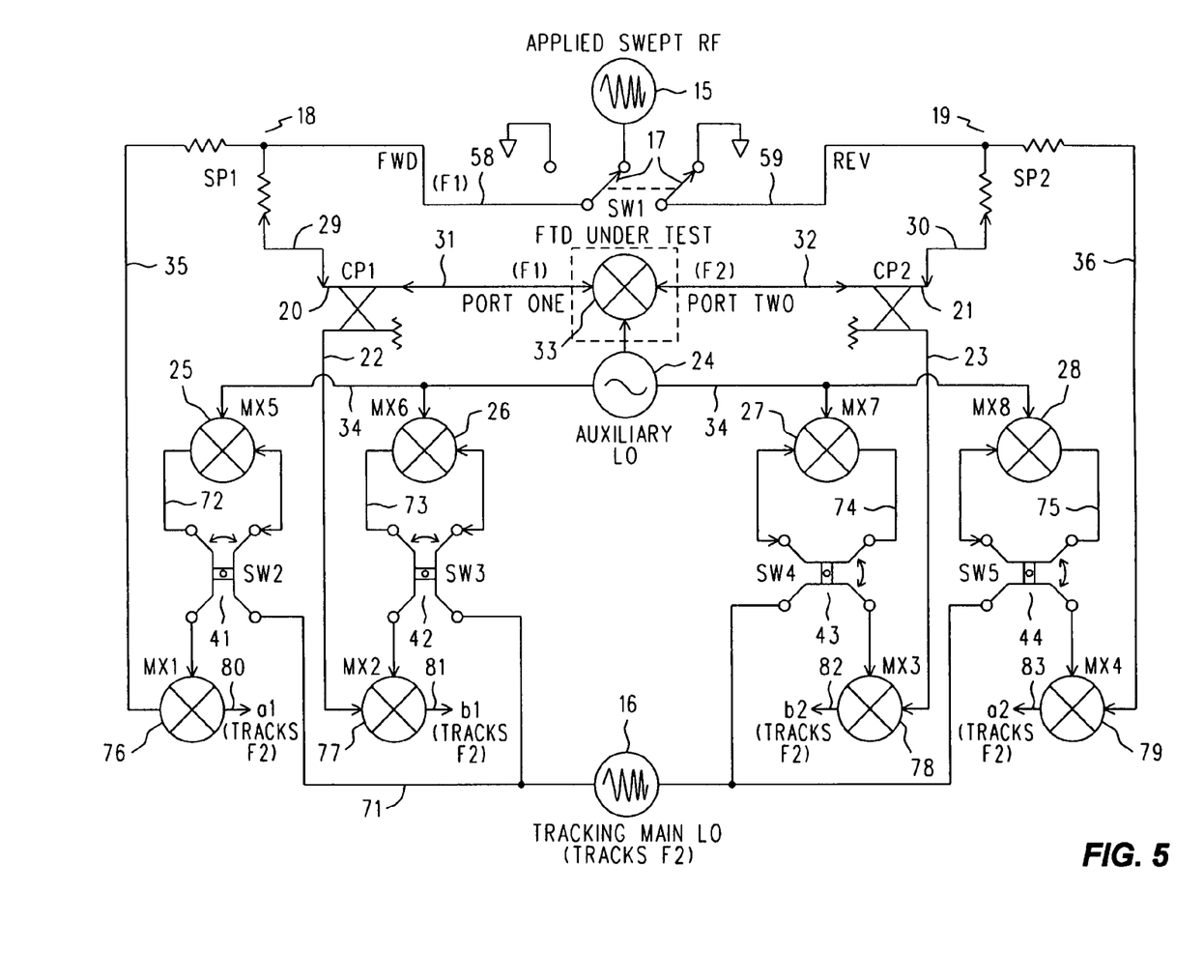
FIG. 5 is a simplified block diagram of the front end of a vector network analyzer equipped with independently tunable forward and reverse receivers in the LO path, showing a configuration for forward measurement.
Figure 6:
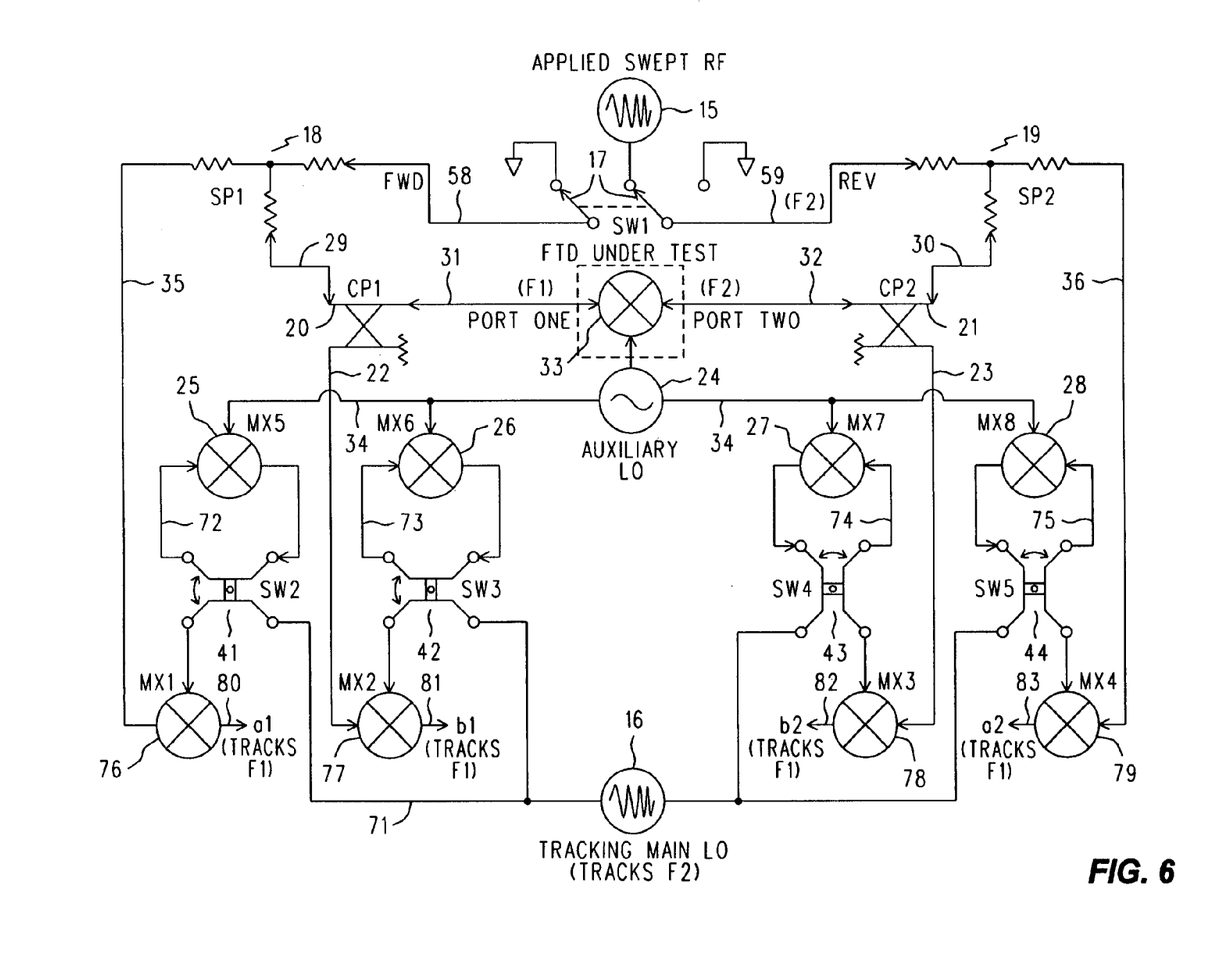
FIG. 6 is a simplified block diagram similar to that of FIG. 5 but configured to perform a reverse measurement.

FIGS. 5 and 6 show simplified block diagrams of an alternate embodiment where those additional mixers are located in the LO path. FIG. 5 illustrates a FWD measurement, while FIG. 6 is the same block diagram configured for a REV measurement.

With reference now to FIG. 5, then, the top half of the figure is same as for FIGS. 2 and 3, and corresponding items have the same reference numerals. The bottom half of FIG. 5 has the same overall collection of components, although they are interconnected in a different fashion. Mixers MX1-MX4 remain, as before, the 'receivers' of the VNA, and since their function is still what it was in the earlier figures, they are still denoted as MX1-MX4. Similarly, switches SW2-SW5 have functionality closely related to their like-named counterparts in the earlier figures, so that they are still denoted as SW2-SW5. These elements and some of their associated signals do have different reference numerals, however, since they are operated according to a different embodiment.

To continue, note that in FIG. 5 all four receivers MX1 (76), MX2 (77), MX3 (78) and MX4 (79) are tuned to F2 during a FWD measurement. This is as things were in FIG. 2, except that the 'tuning' is accomplished by operating the FWD receivers MX1 and MX2 with a an LO (72, 73) that is neither the signal 34 from the Auxiliary LO 24 nor the signal 71 from the Tracking Main LO 16, but is instead either the sum (if the FTD 33 converts up in frequency) or the difference (if the FTD 33 converts down in frequency) produced by mixing those two LOs 34 and 71 together in MX5 (25) and MX6 (26). To arrange this, switches SW2 (41) and SW3 (42) are set as shown, and the sum and difference is applied to MX1 and MX2. The narrowband nature of the receivers selects the proper sideband as $a_1$ (80) referenced to F2 and $b_1$ (81) referenced to F2.

During a FWD measurement MX3 (78) and MX4 (79) will be properly tuned if their LO is simply the Tracking Main LO (since the FTD itself does the conversion that MX5 and MX6 were needed for), and switches SW4 (43) and SW5 (44) are set to bypass MX7 (27) and MX8 (28). At the same time, SW4 and SW5 arrange that MX3 and MX4 receive signal 71 from the Tracking Main LO 16. Thus, $b_2$ (82) and $a_2$ (83) are referenced to F2, just as they were in FIG. 2.

A very similar situation is shown in FIG. 6 for operation in REV direction using the additional mixers in the LO path. In this case, however, MX1 and MX2 can operate as in FIG. 3, so SW2 and SW3 are set to bypass MX5 and MX6, respectively, and to supply the Main Tracking LO's signal 71, instead. By the same token, MX7 and MX8 are now used as converters whose sum and difference is supplied by SW4 and SW5, respectively, to MX3 and MX4. In this case all four receivers MX1-MX4 operated to produce instances of $a_1$, $b_1$, $a_2$ and $b_2$ at F1, similar to the situation shown in FIG. 3.

We claim

1. A method of obtaining network analysis parameters for a frequency translation device, the method comprising the steps of:
   driving a first port of the frequency translation device in a forward direction with an applied test signal having a first swept frequency;
   converting within the frequency translation device the applied test signal having the first swept frequency to a translated test signal having a second swept frequency different from the first swept frequency by the frequency of an auxiliary local oscillator;

heterodyning a portion of the applied test signal having the first swept frequency with the signal from the auxiliary local oscillator to produce a substitute applied test signal having the second swept frequency;

measuring the substitute applied test signal having the second swept frequency with a tracking receiver tuned to the second swept frequency to obtain the network analysis parameter $a_1$;

heterodyning a portion of a reflection from the first port of the applied test signal having the first swept frequency with the signal from the auxiliary local oscillator to produce a substitute reflected applied test signal having the second swept frequency;

measuring the substitute reflected applied test signal having the second swept frequency with a tracking receiver tuned to the second swept frequency to obtain the network analysis parameter $b_1$; and measuring a portion of the translated test signal having the second swept frequency and appearing at a second port of the frequency translation device with a tracking receiver tuned to the second swept frequency to obtain the network analysis parameter $b_2$.

2. A method of obtaining network analysis parameters for a frequency translation device, the method comprising the steps of:

driving a second port of the frequency translation device in a reverse direction with an applied test signal having a second swept frequency;

converting within the frequency translation device the applied test signal having the second swept frequency to a translated test signal having a first swept frequency different from the first swept frequency by the frequency of an auxiliary local oscillator;

heterodyning a portion of the applied test signal having the second swept frequency with the signal from the auxiliary local oscillator to produce a substitute applied test signal having the first swept frequency;

measuring the substitute applied test signal having the first swept frequency with a tracking receiver tuned to the first swept frequency to obtain the network analysis parameter $a_2$;

heterodyning a portion of a reflection from the second port of the applied test signal having the second swept frequency with the signal from the auxiliary local oscillator to produce a substitute reflected applied test signal having the first swept frequency;

measuring the substitute reflected applied test signal having the first swept frequency with a tracking receiver tuned to the first swept frequency to obtain the network analysis parameter $b_2$; and measuring a portion of the translated test signal having the first swept frequency and appearing at a first port of the frequency translation device with a tracking receiver tuned to the first swept frequency to obtain the network analysis parameter $b_1$.

* * * * *

UNITED STATES PATENT AND TRADEMARK OFFICE
CERTIFICATE OF CORRECTION

| | | |
|---|---|---|
| PATENT NO. | : 7,248,033 B2 | Page 1 of 1 |
| APPLICATION NO. | : 10/967877 | |
| DATED | : July 24, 2007 | |
| INVENTOR(S) | : Anderson et al. | |

It is certified that error appears in the above-identified patent and that said Letters Patent is hereby corrected as shown below:

On the Title page, Item (75), in "Inventors", delete "James C. Lui," and insert -- James C. Liu, --, therefor.

Signed and Sealed this

Eighteenth Day of December, 2007

JON W. DUDAS
*Director of the United States Patent and Trademark Office*